United States Patent
Park

(10) Patent No.: US 9,070,443 B2
(45) Date of Patent: Jun. 30, 2015

(54) EMBEDDED SOLID STATE DISK AS A CONTROLLER OF A SOLID STATE DISK

(71) Applicant: Samsung Electronics Co., Ltd., Suwon-si, Gyeonggi-do (KR)

(72) Inventor: KwangSoo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 214 days.

(21) Appl. No.: 13/732,893

(22) Filed: Jan. 2, 2013

(65) Prior Publication Data

US 2013/0208542 A1 Aug. 15, 2013

(30) Foreign Application Priority Data

Feb. 10, 2012 (KR) .................. 10-2012-0013623

(51) Int. Cl.
*G11C 16/04* (2006.01)
*G06F 3/06* (2006.01)
*G11C 16/30* (2006.01)
*G06F 12/02* (2006.01)
*G11C 5/04* (2006.01)

(52) U.S. Cl.
CPC ............. *G11C 16/04* (2013.01); *G11C 16/30* (2013.01); *G06F 3/0607* (2013.01); *G06F 12/0246* (2013.01); *G11C 5/04* (2013.01); *G06F 3/0626* (2013.01); *G06F 3/0656* (2013.01); *G06F 3/0658* (2013.01); *G06F 3/0679* (2013.01)

(58) Field of Classification Search
CPC ........... G11C 16/3459; G11C 16/3495; G11C 29/50; G11C 29/52; G11C 29/24; G11C 29/42; G11C 16/30; G11C 5/04; G11C 5/02; G06F 11/10; G06F 12/00; G06F 11/14; G06F 11/1068; G06F 11/1016; G06F 11/1666; G06F 11/20; G06F 12/0246; G06F 11/08; G06F 3/061; G06F 13/385; G06F 3/0625; G06F 3/0632; G06F 3/0688; G06F 3/0626; H03M 13/155; H01L 23/4824; H01L 27/0207; H01L 27/0218; H01L 27/11526; H01L 27/11573; H01L 23/573; H01L 24/83; H01L 23/13; G06K 9/0002
USPC ........... 711/103, 104, 112, 114, 115; 714/6.2, 714/6.32, 773; 365/51; 327/541; 438/107; 257/686
See application file for complete search history.

(56) References Cited

U.S. PATENT DOCUMENTS

| 4,559,881 A | 12/1985 | Lankard et al. |
| 6,531,773 B2 | 3/2003 | Nishizawa et al. |
| 6,724,680 B1 | 4/2004 | Ng et al. |
| 2002/0030270 A1 | 3/2002 | Nishizawa et al. |

(Continued)

FOREIGN PATENT DOCUMENTS

| JP | 2011-81680 A | 4/2011 |
| JP | 2011-81681 A | 4/2011 |

(Continued)

*Primary Examiner* — J. H. Hur
*Assistant Examiner* — Ajay Ojha
(74) *Attorney, Agent, or Firm* — Myers Bigel Sibley & Sajovec, P.A.

(57) ABSTRACT

A Solid State Disk (SSD) includes a plurality of nonvolatile memory devices storing data, and an embedded solid state disk controlling the plurality of nonvolatile memory devices. The SSD uses an embedded SSD (eSSD) as a controller. Thus, the SSD can be embodied in a small area. Also, since the SSD does not need an additional process for manufacturing a controller, manufacturing cost per unit may be reduced.

20 Claims, 20 Drawing Sheets

(56) References Cited

U.S. PATENT DOCUMENTS

| | | | |
|---|---|---|---|
| 2005/0282310 A1* | 12/2005 | Zhou | 438/107 |
| 2006/0101176 A1 | 5/2006 | Eric et al. | |
| 2008/0175089 A1 | 7/2008 | Heo et al. | |
| 2009/0063895 A1* | 3/2009 | Smith | 714/7 |
| 2009/0164722 A1 | 6/2009 | Lee et al. | |
| 2010/0036999 A1* | 2/2010 | Zhuang et al. | 711/103 |
| 2010/0049914 A1* | 2/2010 | Goodwin | 711/114 |
| 2010/0067278 A1* | 3/2010 | Oh et al. | 365/51 |
| 2010/0232124 A1 | 9/2010 | Bang et al. | |
| 2010/0328499 A1 | 12/2010 | Sun | |
| 2011/0035540 A1* | 2/2011 | Fitzgerald et al. | 711/103 |
| 2011/0074338 A1 | 3/2011 | Wu | |
| 2011/0089553 A1* | 4/2011 | Kim et al. | 257/686 |
| 2011/0090001 A1* | 4/2011 | Arisaka et al. | 327/541 |

FOREIGN PATENT DOCUMENTS

| | | |
|---|---|---|
| KR | 2000-0061045 A | 10/2000 |
| KR | 10-2010-0035210 A | 4/2010 |
| KR | 10-2010-0062190 A | 6/2010 |

* cited by examiner

EMBEDDED SOLID STATE DISK AS A CONTROLLER OF A SOLID STATE DISK

CROSS-REFERENCE TO RELATED APPLICATION

This application claims priority under 35 U.S.C. §119 to Korean Patent Application No. 10-2012-0013623, filed on Feb. 10, 2012, the contents of which are hereby incorporated by reference in their entirety.

BACKGROUND

The inventive concepts herein relate to storage devices, and more particularly, to embedded solid state disk and solid state disk storage devices.

Examples of semiconductor memory devices commonly used as storage devices include volatile memories such as DRAM, SRAM, etc. and nonvolatile memories such as EEPROM, FRAM, PRAM, MRAM, flash memory, etc. Volatile memories lose their stored data when their power supplies are interrupted while nonvolatile memories maintain their stored data even when their power supplies are interrupted.

Devices using nonvolatile memories are being increasingly used. For instance, an MP3 player, a digital camera, a cell phone, a camcorder, a flash card and a solid state disk use nonvolatile memories as a storage device.

A solid state disk (SSD) can read data or write data at a higher speed than a hard disk. Since the SSD does not have parts that move physically, an operation noise may not be generated and power consumption may be reduced. Thus, a hold time of a battery may be increased by using the SSD in a portable device.

SUMMARY

Embodiments of the inventive concepts provide a solid state disk. The solid state disk may include a plurality of nonvolatile memory devices configured to store data, and a controller configured to control the plurality of nonvolatile memory devices. The controller may have a structure such that at least two layers are stacked.

Other embodiments of the inventive concepts also provide an embedded solid state disk. The embedded solid state disk may include an internal central processing unit, an internal nonvolatile memory configured to store data under control of the internal central processing unit, and a plurality of external memory interfaces, a respective one of which is configured to interface with a respective one of a plurality of external nonvolatile memories located outside the embedded solid state disk, under control of the internal central processing unit.

Yet other embodiments of the inventive concepts also provide a solid state disk comprising a single package embedded solid state disk that includes therein an internal solid state disk controller and an internal nonvolatile memory. A plurality of external nonvolatile memory device packages are provided external to the single package embedded solid state disk and are connected to the single package embedded solid state disk. The internal solid state disk controller is configured to control the plurality of external nonvolatile memory device packages. In some embodiments, the internal solid state disk controller and the internal nonvolatile memory are included in different layers of the single package embedded solid state disk. Moreover, in some embodiments, the single package solid state disk further includes therein a host channel and a plurality of nonvolatile memory channels, a respective one of which is configured to connect to a respective one of the plurality of external nonvolatile memory device packages. The plurality of nonvolatile memory channels are disposed about a periphery of the single package embedded solid state disk. In other embodiments, the single package embedded solid state disk may further include therein a decoupling capacitor and/or a voltage regulator.

BRIEF DESCRIPTION OF THE FIGURES

Various embodiments of the inventive concepts will be described below in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art. Like numbers refer to like elements throughout.

DETAILED DESCRIPTION OF THE EMBODIMENTS

Figure 1:
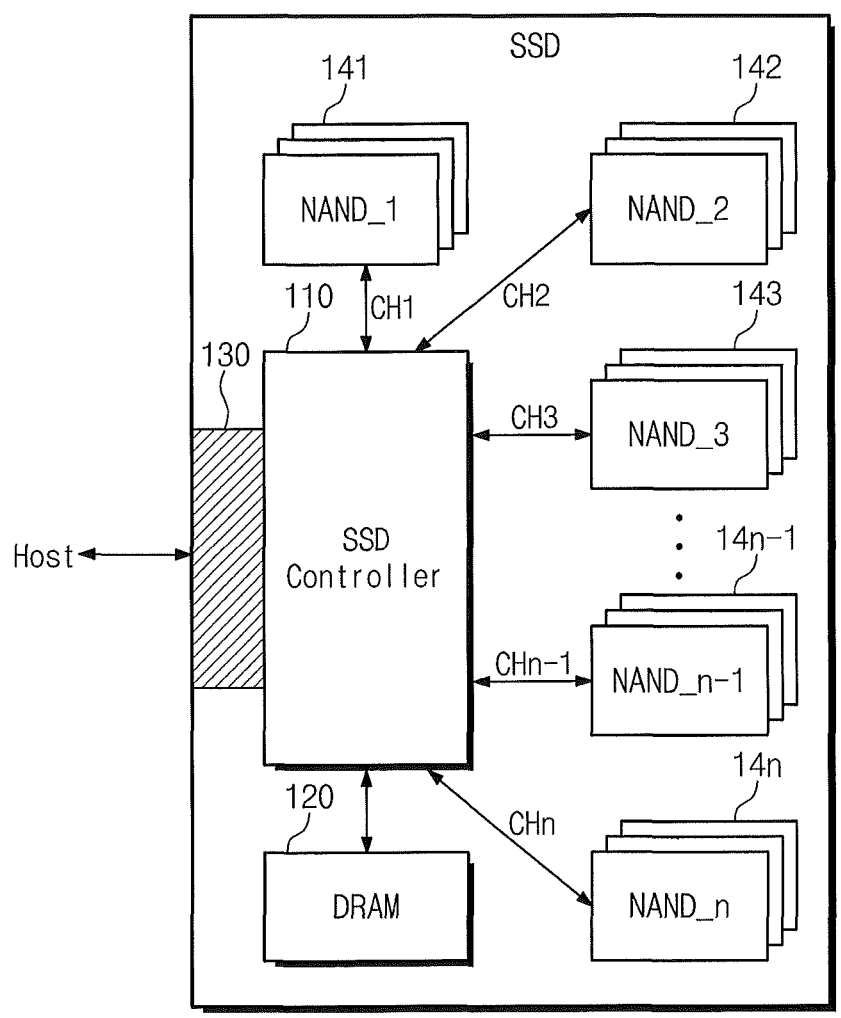
FIG. 1 is a block diagram illustrating a solid state disk (SSD) in accordance with some embodiments of the inventive concepts.

Embodiments of the inventive concepts will be described more fully hereinafter with reference to the accompanying drawings. These inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Hereinafter, a solid state disk (SSD) and an embedded solid state disk (eSSD) are used as a storage device or an example of storage device for explaining features and functions of the inventive concepts. However, those skilled in the art will readily appreciate other advantages and performance of the inventive concepts according to the contents described here. Also, the inventive concepts may be embodied or applied through other some embodiments. Further, various modifications may be made in the embodiments without departing from the spirit and scope of the inventive concepts.

FIG. 1 is a block diagram illustrating a solid state disk (SSD) in accordance with some embodiments of the inventive concepts. Referring to FIG. 1, the SSD 100 includes an SSD controller 110, a DRAM 120, a pad 130 and a plurality of NAND flash memories 141~14n.

The SSD controller 110 exchanges a signal with a host. The signal exchanged between the SSD controller 110 and the host may include a command, an address, data, etc. The SSD controller 110 writes data in a corresponding NAND flash memory and reads data from a corresponding NAND flash memory. Thus, the SSD controller 110 is configured to control access to the plurality of NAND flash memories 141~14n. An internal composition of the SSD controller 110 is described in detail with reference to FIG. 2.

The DRAM 120 is used as a buffer area temporarily storing data received from the host or temporarily storing data read from the NAND flash memories 141~14n. The DRAM 120 may also be used to drive a software used for an effective management of the NAND flash memories 141~14n. The DRAM 120 may be used to store meta data received from the host and/or may be used to store cache data. In some other embodiments of the inventive concepts, the SSD 100 may be embodied by replacing the DRAM with volatile memories such as SRAM, etc. or nonvolatile memories such as flash memory, FRAM, MRAM, ReRAM, FRAM, etc.

The plurality of NAND flash memories 141~14n is used as a storage medium. The plurality of NAND flash memories 141~14n may be connected to the SSD controller 110 through a plurality of channels CH1~CHn. One or more NAND flashes may be connected to one channel. A NAND flash memory connected to one channel may be connected to the same data bus. In some other embodiments of the inventive concepts, the SSD 100 may be embodied to use nonvolatile memories such as PRAM, MRAM, ReRAM, FRAM, etc. as a storage medium in place of a flash memory.

The SSD 100 may further include the pad 130 to be connected to the host. The SSD 100 can be easily attached to or detached from the host through the pad 130. The pad 130 may be formed inside the SSD 100 as illustrated in FIG. 1 or may be formed in the form of connector outside the SSD 100. In some other embodiments of the inventive concepts, the SSD 100 may not include the pad 130 and may be connected to the host through a routing process.

Figure 2:
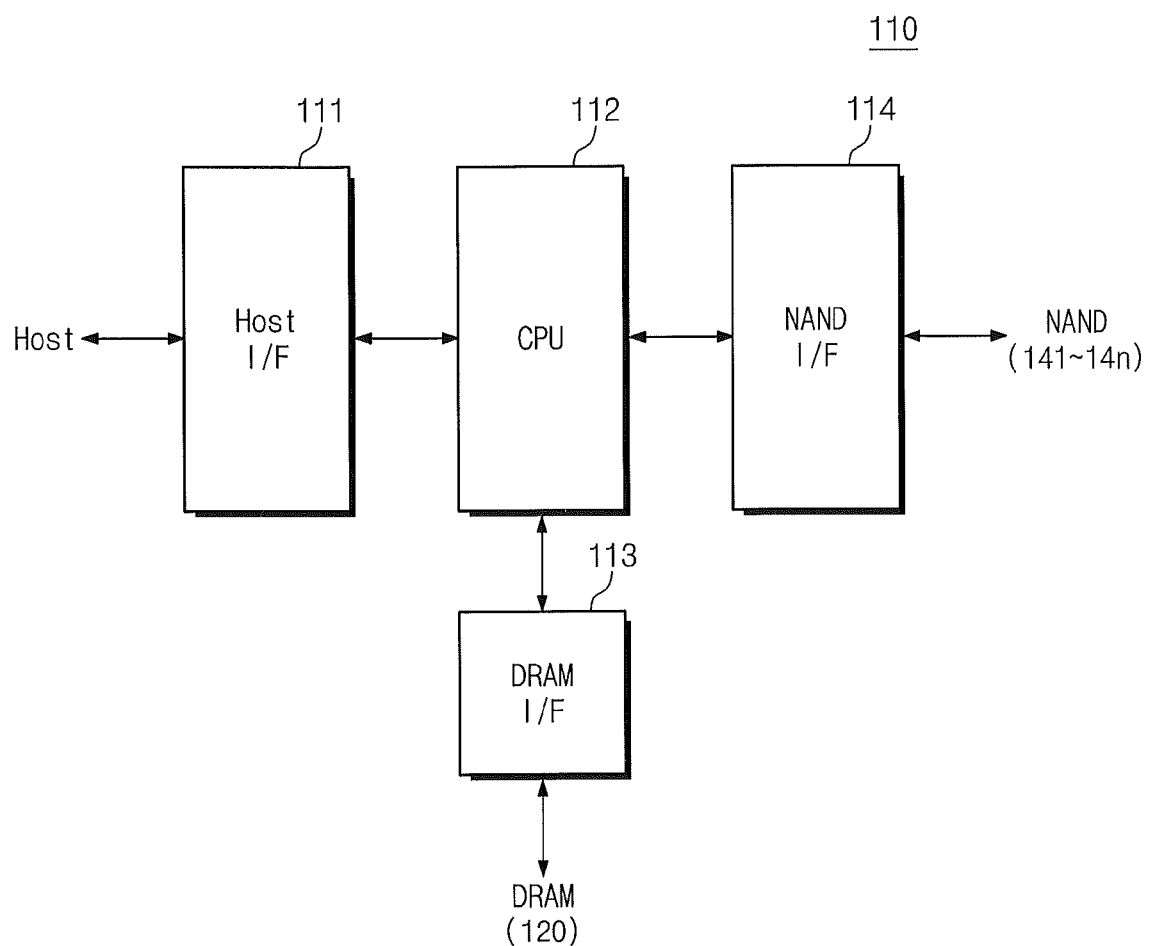
FIG. 2 is a block diagram illustrating a structure of SSD controller illustrated in FIG. 1.

FIG. 2 is a block diagram illustrating a structure of SSD controller 110 illustrated in FIG. 1. Referring to FIG. 2, the SSD controller 110 includes a host interface 111, a central processing unit 112, a DRAM interface 113 and a NAND interface 114.

The host interface 111 provides an interfacing with the SSD 110 in response to a protocol of the host. The host interface 111 can communicate with the host using a universal serial bus (USB), a small computer system interface (SCSI), a PCI express, an ATA, a parallel ATA, a serial ATA, a serial attached SCSI, etc. The host interface 111 can perform a function of disk emulation so that the host recognizes the SSD 100 as a hard disk drive (HDD).

The DRAM interface 113 transmits data received from the host to the DRAM 120 or transmits data read from the plurality of NAND flash memories 141~14n to the DRAM 120. The NAND interface 114 distributes data received from the host or data transmitted from the DRAM 120 over the channels CH1~CHn. The NAND interface 114 transmits data read from the NAND flash memories to the host via the host interface 111 or to the DRAM 120 via the DRAM interface 113.

The central processing unit 112 controls an overall operation of the SSD controller 110. The central processing unit 112 analyzes and processes a signal received from the host. The central processing unit 112 can control the DRAM 120 or the flash memories 141~14n according to a firmware for driving the SSD 100.

As described in FIGS. 1 and 2, the SSD 100 uses nonvolatile memories such as a flash memory as a storage medium and can store huge amounts of data. The SSD 100 may be used to replace a hard disk being used in a PC, notebook, etc. The SSD 100 may be used in a mobile device such as smart phone, tablet PC, digital camera, MP3 player, PDA, etc. The SSD 100 can be made in the form that can be attached to or detached from the host and may be attached to the host to enlarge a storage space of the host.

Figure 3:
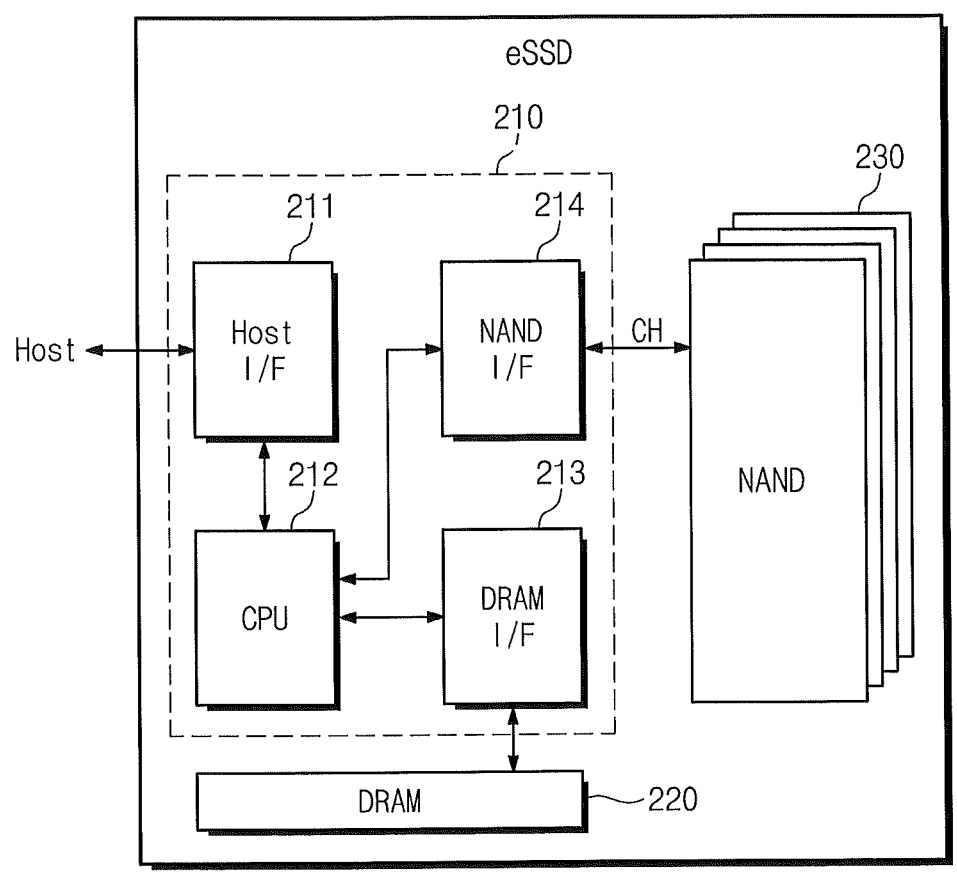
FIG. 3 is a block diagram illustrating an embedded solid state disk in accordance with some embodiments of the inventive concepts.

FIG. 3 is a block diagram illustrating an embedded solid state disk (eSSD) in accordance with some embodiments of the inventive concepts. Referring to FIG. 3, eSSD 200 includes an eSSD controller 210, a DRAM 220 and NAND flash memories 230. The eSSD 200 may be provided as a single package, and in some embodiments, as a single chip.

The eSSD controller 210 exchanges a signal with a host. The eSSD controller 210 writes data in the NAND flash memory 230 or reads data from the NAND flash memory 230. The eSSD controller 210 includes a host interface 211, a central processing unit 212, a DRAM interface 213 and a NAND interface 214.

The host interface 211 provides an interfacing with the eSSD 200 in response to a control of the central processing unit 212. The DRAM interface 213 stores data received from the host or the NAND flash memory 230 in the DRAM 220 or transmits data stored in the DRAM 220 to the host or the NAND flash memory 230. The central processing unit 212 controls an overall operation of the eSSD controller 210.

The interfaces 211, 213 and 214 of eSSD controller 210 may perform a communication operation in the same manner as the interfaces 111, 113 and 114 of the SSD controller 110 of FIG. 1. For instance, the host interface 211 of the eSSD controller 210 can communicate with the host using a universal serial bus (USB), a small computer system interface (SCSI), a PCI express, an ATA, a parallel ATA, a serial ATA, a serial attached SCSI, etc. like the host interface 111 of the SSD controller 110.

The DRAM 220 is used as a buffer area temporarily storing data received from the host or temporarily storing data read from the NAND flash memory 230.

The NAND flash memory 230 is used as a storage medium of eSSD 200. The NAND flash memory 230 is connected to the eSSD controller 210 through one channel CH. One or more NAND flash memories may be connected to one channel CH. Since the eSSD is directly mounted on the main board unlike the SSD 100, it includes fewer NAND flash memories as compared with the SSD 100.

In some other embodiments of the inventive concepts, the eSSD 200 may be embodied by replacing the DRAM with a volatile memory such as a SRAM or a nonvolatile memory such as a flash memory, PRAM, MRAM, ReRAM, FRAM, etc. The eSSD 200 may be embodied to use a nonvolatile memory such as PRAM, MRAM, ReRAM, FRAM, etc. as a storage medium in place of a flash memory.

In FIG. 3, the NAND flash memory 230 of the eSSD 200 is connected to the eSSD controller 210 through one channel. However, the inventive concepts are not limited thereto. For instance, the eSSD 200 may further include a plurality of NAND flash memories besides the NAND flash memory 230 and the plurality of NAND flash memories may be connected to the eSSD controller 210 through different channels respectively. The NAND flash memory 230 may be connected to the eSSD controller 210 through a plurality of channels. That is, the NAND flash memory 230 includes a plurality of NAND flash memories and the plurality of NAND flash memories may be connected to the eSSD controller 210 through different channels respectively.

Figure 4:
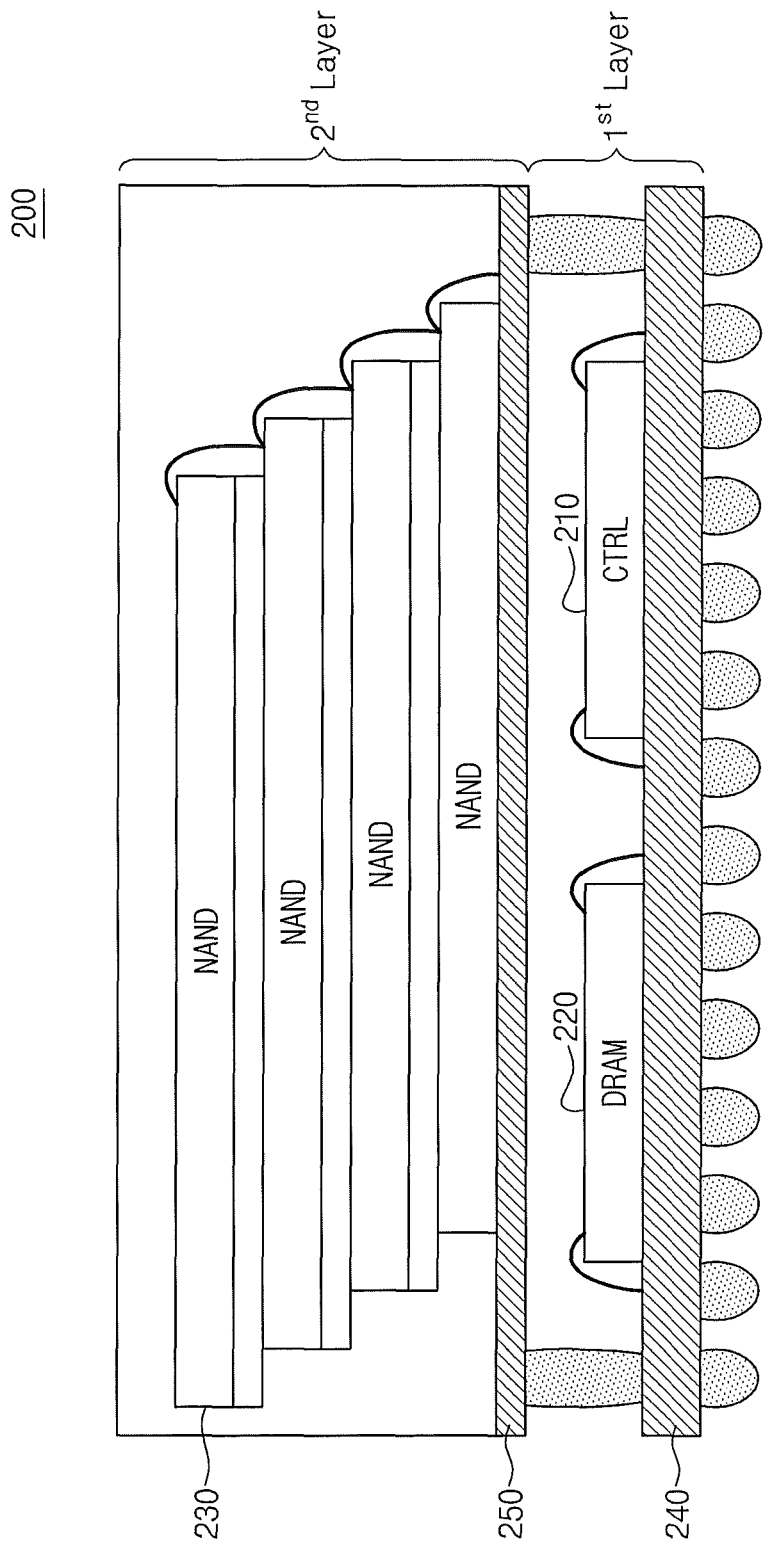
FIGS. 4 through 6 are cross sectional views illustrating a structure of eSSD of FIG. 3.

FIG. 4 is a cross sectional view illustrating a structure of eSSD of FIG. 3. Referring to FIG. 4, the eSSD 200 may be provided in the laminated form of a first layer and a second layer.

The first layer includes an eSSD controller 210 and a DRAM 220 that are mounted on a first PCB substrate 240. The eSSD controller 210 writes data in the NAND flash memory 230 or reads data from the NAND flash memory 230 according to a command of a host. The DRAM 220 is provided as a buffer memory of the eSSD 200 or a working memory of the eSSD 200.

The second layer includes NAND flash memories 230 mounted on a second PCB substrate 250. The NAND flash memories 230 may have a laminated structure of stair form for routing. The NAND flash memory 230 stores data in response to a control of the eSSD controller 210.

The structure of the eSSD 200 of FIG. 4 is an illustration of the inventive concepts and is not limited thereto.

Figure 5:
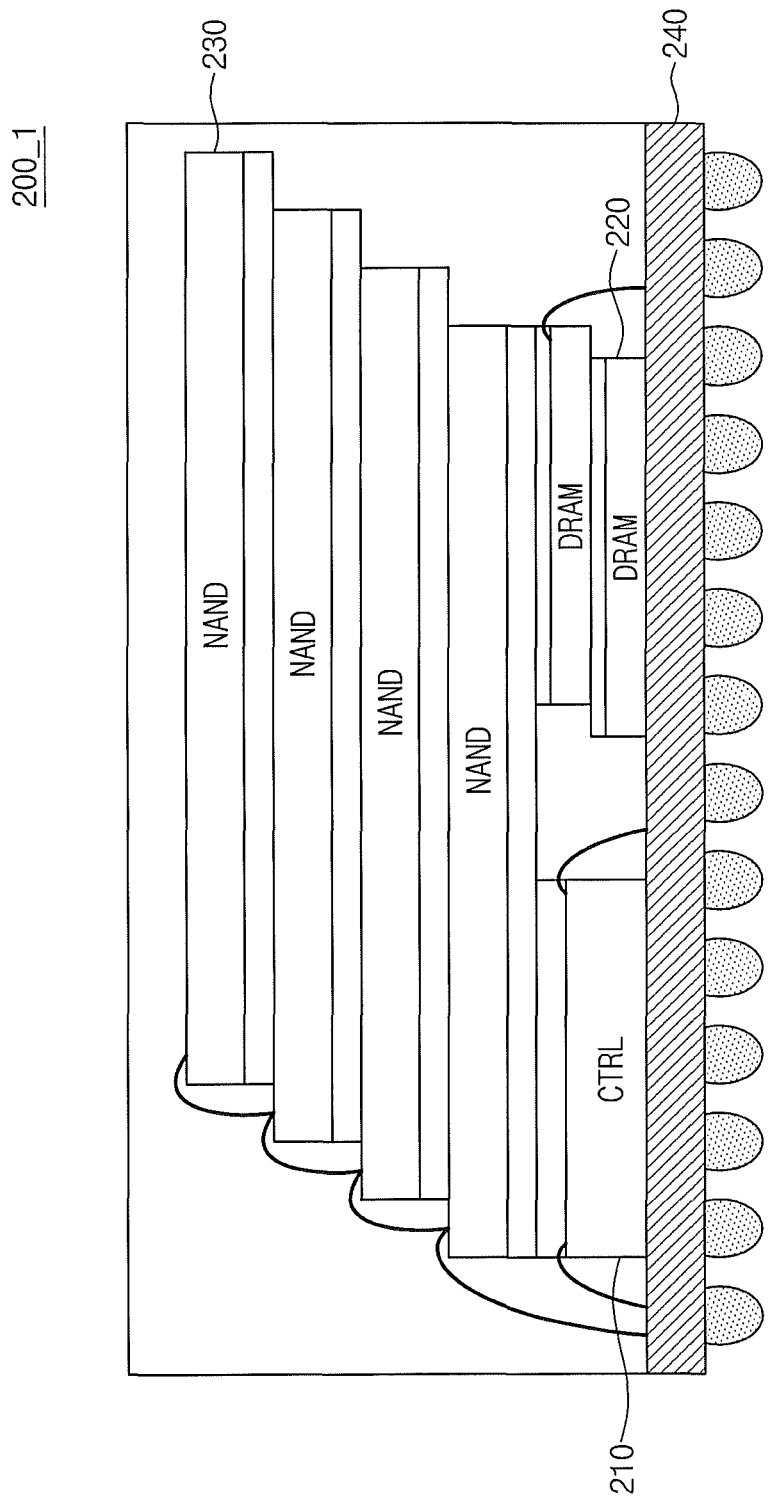
Figure 6:
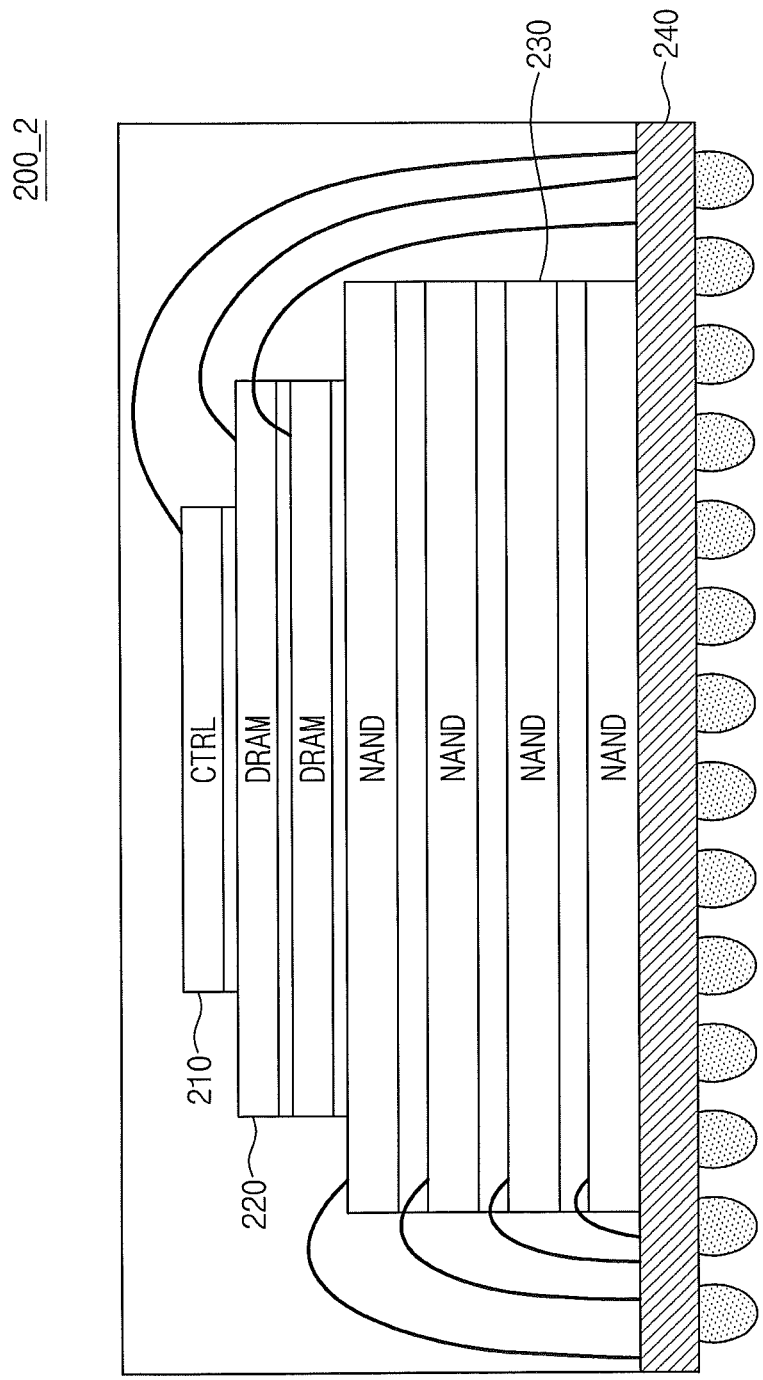

FIGS. 5 and 6 are cross sectional views illustrating other embodiments of structure of the eSSD 200. As illustrated in FIGS. 5 and 6, eSSD (200_1, 200_2) includes one PCB substrate 240 and all devices are stacked on a single substrate.

The eSSD (200_1, 200_2) of FIGS. 5 and 6 is similar to the structure of eSSD 200 of FIG. 3. Thus, like numbers refer to like elements throughout.

Referring to FIG. 5, the eSSD 200_1 includes a single PCB substrate 240, and the eSSD controller 210 and the DRAM 220 may be mounted on the PCB substrate 240. The NAND flash memories 230 may be stacked on the eSSD controller 210 and the DRAM 220. In this case, the eSSD controller 210, the DRAM 220 and the NAND flash memories 230 are connected to the PCB substrate 240 by a wire bonding.

Referring to FIG. 6, the eSSD 200_2 includes a single substrate 240 and the NAND flash memories 230 may be mounted on the PCB substrate 240. The DRAM 220 and the eSSD controller 210 may be mounted on the NAND flash memories 230.

Figure 7:
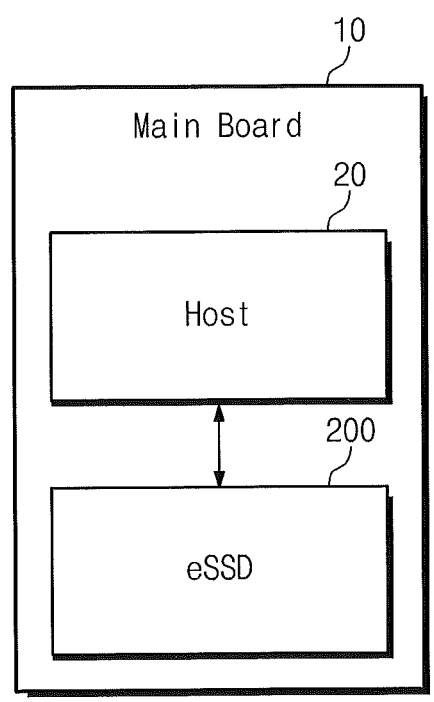
FIG. 7 is a drawing illustrating an example that the eSSD of FIG. 3 is mounted on a main board.

FIG. 7 is a drawing illustrating an example that the eSSD 200 of FIG. 3 is mounted on a main board. Referring to FIG. 7, the eSSD 200 is mounted on the main board 10 and communicates with the host 20 mounted on the main board 10.

Since the eSSD 200 is directly mounted on the main board unlike the SSD 100 of FIG. 1, it is embodied to have a relatively small area as compared with the SSD 100. As illustrated in FIG. 4, the eSSD 200 has a laminated structure of the first layer and the second layer and thereby it may be embodied with a small area as compared with SSD 100. The eSSD 200 includes fewer NAND flash memories as compared with the SSD 100 and thereby it may be embodied with a small area as compared with SSD 100.

Referring to FIGS. 1 and 2 again, the SSD 100 includes the SSD controller 110, the DRAM 120 and components such as NAND flash memories 141~14n. The SSD 100 is provided to a user in the set form that those components are mounted on the board. In this case, the SSD controller 110 is made in a single type package through a predetermined process, and then it is mounted on the board. The eSSD 200 110 is made in a single type package through a different process from the process of the SSD controller 110, and then it is provided to a user.

An SSD (hereinafter it is referred to as an "alternative SSD") in accordance with some other embodiments of the inventive concepts, replaces the SSD controller with eSSD. In this case, since a predetermined process for manufacturing the SSD controller is not needed, cost for manufacturing the alternative SSD may be reduced. The eSSD (hereinafter it is referred to as an "alternative eSSD") used in the alternative SSD has a different structure from the eSSD of FIG. 3. Hereinafter, the alternative SSD and the alternative eSSD will be described in further detail.

Figure 8:
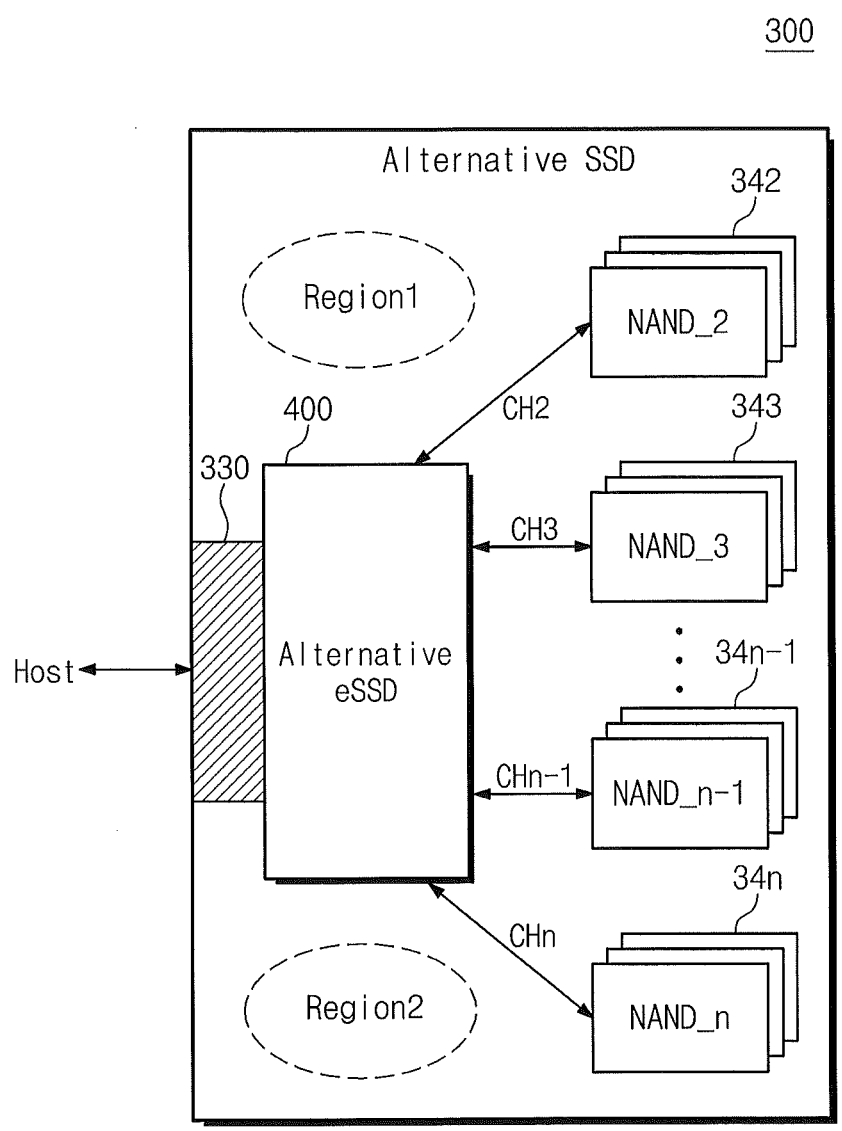
FIG. 8 is a block diagram illustrating an alternative solid state disk (SSD) in accordance with some other embodiments of the inventive concepts.

FIG. 8 is a block diagram illustrating an alternative solid state disk (SSD) 300 in accordance with some other embodiments of the inventive concepts. Referring to FIG. 8, the alternative SSD 300 includes a pad 330, a plurality of flash memories 342~34n and an alternative eSSD 400. The alternative eSSD 400 may be embodied as a single package, and in some embodiments as a single chip. A composition of the alternative SSD 300 is similar to a composition of the SSD 100 of FIG. 1. Thus, hereinafter, a difference between the two compositions will be mainly described.

Unlike the SSD 100 of FIG. 1, the alternative SSD 300 includes the alternative eSSD 400 in place of the SSD controller. The alternative SSD 300 is made in a single type package and in some embodiments as a single chip, and since it is used to make a set of the SSD 300, it may be directly mounted on the main board like the eSSD 200 of FIG. 3. Since the alternative SSD 300 uses the alternative eSSD 400 as a controller, it can secure a region 1 and region 2 as a vacant space as compared with the SSD 100 of FIG. 1.

The alternative eSSD 400 performs an interfacing with the host in the same manner of the SSD controller 110 of the SSD 100 of FIG. 1. The alternative eSSD 400 is manufactured to include DRAM and NAND flash memory therein. Thus, the SSD 300 of FIG. 8 may not separately include the DRAM 120 and the NAND flash memory 141, unlike the SSD 100 of FIG. 1.

Figure 9:
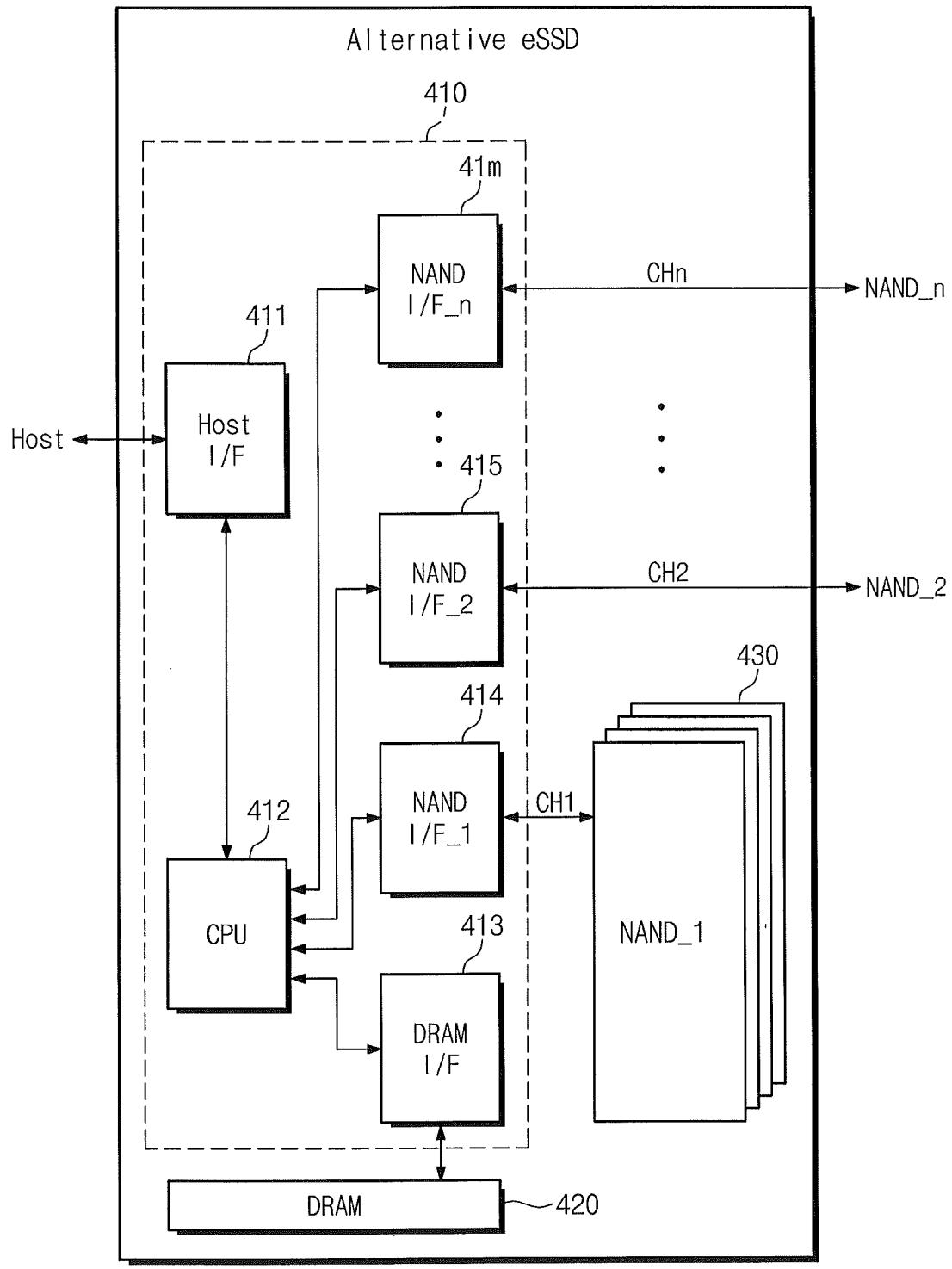
FIG. 9 is a block diagram illustrating a structure of an alternative eSSD of FIG. 8 in further detail.

FIG. 9 is a block diagram illustrating a structure of an alternative eSSD 400 of FIG. 8 in further detail. The structure of alternative eSSD 400 of FIG. 9 is similar to the structure of the eSSD 200 of FIG. 3. Thus, hereinafter, a difference between the two structures will be mainly described.

Referring to FIG. 9, the alternative eSSD 400 includes an eSSD controller 410, a DRAM 420 and NAND flash memory 430. Since the alternative eSSD 400 includes the DRAM 420, the alternative SSD 300 of FIG. 8 may not include a separate DRAM in the region 2 thereof unlike the SSD 100 of FIG. 3. Since the alternative eSSD 400 includes the NAND flash memory 430, the alternative SSD 300 of FIG. 8 may not include NAND flash memory in the region 1 thereof unlike the SSD 100 of FIG. 1.

The alternative SSD 300 of FIG. 8 may be embodied to be small by as much as the space corresponding to the region 1 and the region 2 as compared with the SSD 100 of FIG. 1. The alternative SSD 300 of FIG. 8 may have improved characteristics as compared with the SSD 100 of FIG. 1 by mounting additional elements on the vacant spaces (region 1, region 2) obtained because the alternative SSD 300 does not include DRAM.

Referring to FIG. 9, the eSSD controller 410 exchanges a signal (command, address, data, etc.) with the host. The eSSD controller 410 writes data in or reads data from corresponding NAND flash among the internal NAND flashes 430 of the alternative eSSD 400 or external NAND flashes 342~34n of the alternative eSSD 400 according to a command of the host. The eSSD controller 410 includes a host interface 411, a central processing unit 412, a DRAM interface 413 and a plurality of NAND interfaces 414~41m.

The host interface 411 provides an interfacing with the host. The DRAM interface 413 provides an interfacing with the DRAM 420. The first NAND interface 414 provides an interfacing with the first NAND flash memory 430. The host interface 411, the DRAM interface 413 and the first NAND interface 414 are similar to the host interface 211, the DRAM interface 213 and the first NAND interface 214. Therefore, a detailed description is not repeated.

The eSSD controller 410 of the alternative eSSD 400 further includes a plurality of NAND interfaces 415~41m performing an interfacing operation with the external NAND flash memories 342~34n of the alternative eSSD 400 unlike the eSSD controller 210 of FIG. 3. The eSSD controller 410 of the alternative eSSD 400 also further includes new channels CH2~CHn for connecting the plurality of NAND interfaces 415~41m to the external NAND flash memories 342~34n unlike the eSSD controller 210 of FIG. 3.

In this case, the new channels CH2~CHn may be disposed differently by various methods. Various illustrations of disposing the new channels CH2~CHn are described in further detail.

In FIG. 9, the NAND flash memory 430 of the alternative eSSD 400 is connected to the eSSD controller 410 through one channel. However, this is only an illustration. For instance, as described in FIG. 3, NAND flashes of the NAND flash 430 may be connected to the eSSD controller 410 through a plurality of channels. The alternative eSSD 400 may further include a plurality of NAND flash memories besides the NAND flash memory 430 and the plurality of NAND flash memories may be connected to the eSSD controller 410 through different channels respectively.

Figure 10:
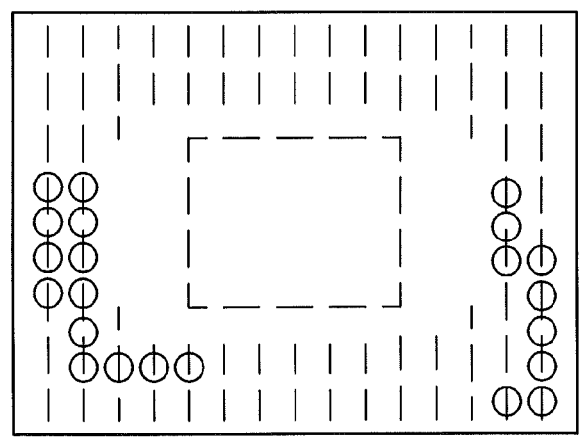
FIG. 10 is a drawing illustrating a ball map for the eSSD of FIG. 3.

FIG. 10 is a drawing illustrating a ball or other external input/output connector map for the eSSD 200 of FIG. 3. FIGS. 11 through 14 are drawings illustrating a ball or other external input/output connector map for the alternative eSSD 400 of FIG. 8.

Figure 11:
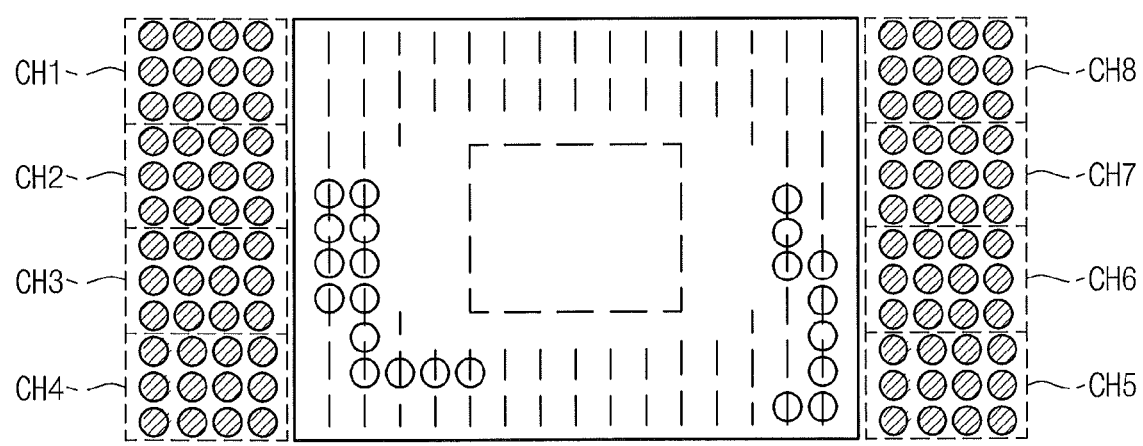
FIGS. 11 through 14 are drawings illustrating a ball map for the alternative eSSD of FIG. 8.
Figure 12:
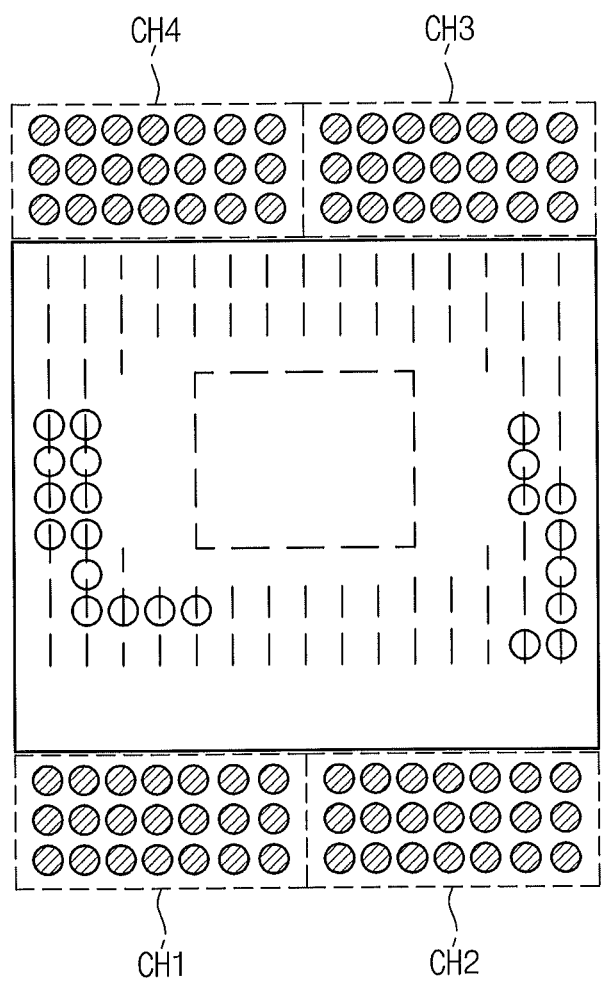
Figure 13:
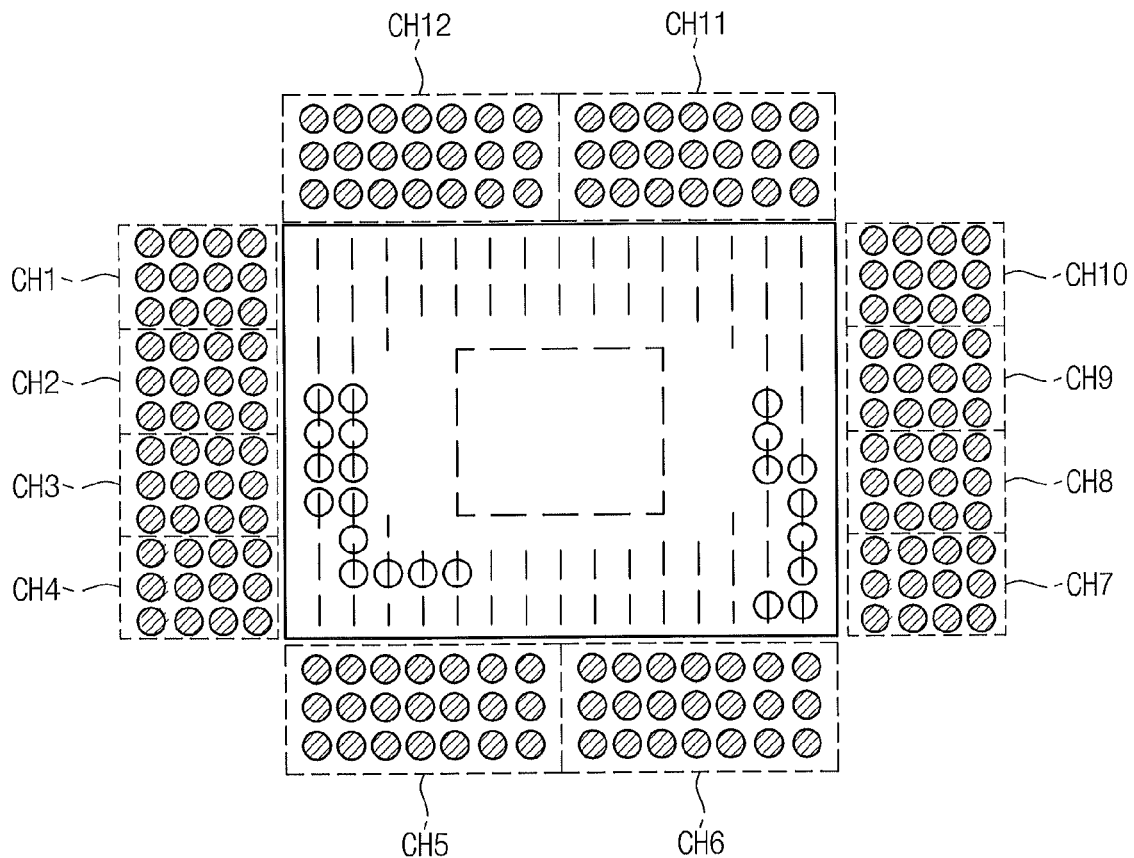

Referring to FIGS. 10 and 11, balls corresponding to the new channels CH2~CHn of the alternative eSSD 400 may be additionally provided at the long side of the eSSD 200 of FIG. 3. Referring to FIGS. 10 and 12, balls corresponding to the new channels CH2~CHn of the alternative eSSD 400 may be additionally provided at the short side of the eSSD 200 of FIG. 3. Referring to FIGS. 10 and 13, balls corresponding to the new channels CH2~CHn of the alternative eSSD 400 may be additionally provided at the short side and the long side of the eSSD 200 of FIG. 3.

As illustrated in FIGS. 11 through 13, when balls for the new channels CH2~CHn of the alternative eSSD 400 are additionally provided at the short side or long side of the eSSD 200 of FIG. 3, the alternative eSSD 400 can maintain compatibility with the eSSD 200 of FIG. 3. In this case, the alternative eSSD 400 can be efficiently manufactured by adding a process of embodying new balls to a process of manufacturing the eSSD 200 of FIG. 3.

When the alternative eSSD 400 is mounted on a board of SSD or a main board of SSD, the added balls are connected to the board of SSD or the main board of SSD by solder. In this case, due to the added balls, the alternative eSSD 400 can be more firmly connected to the board of SSD or the main board of SSD. The added balls can also perform a function of protecting the internal components (e.g., the central processing unit 412) from an external impact.

Due to the added balls, the alternative eSSD 400 may have a strong resistance against an external impact as compared with the eSSD 200 of FIG. 3.

Figure 14:
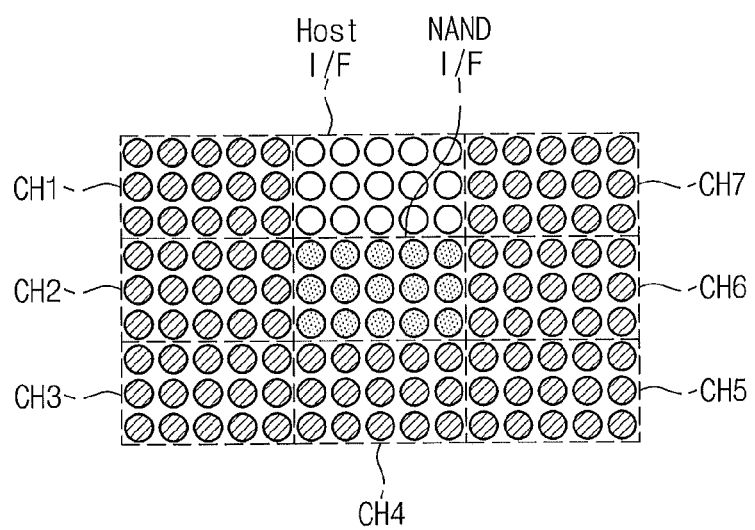

Referring to FIG. 14, the alternative eSSD 400 may be embodied to have a new ball map which is completely different from the eSSD 200 of FIG. 3. In this case, the arrangement of the balls may be designed considering a routing by each group. As illustrated in FIG. 14, balls corresponding to a NAND interface group, a host interface group, etc., may be designed to be arranged in the inside and balls corresponding to each channel may be designed to be sequentially arranged in the outer side (periphery) for convenience of routing with respect to each channel.

FIGS. 15 through 19 are drawings illustrating various application examples of a region 1 and a region 2 of the alternative SSD 300 of FIG. 7.

Figure 15:
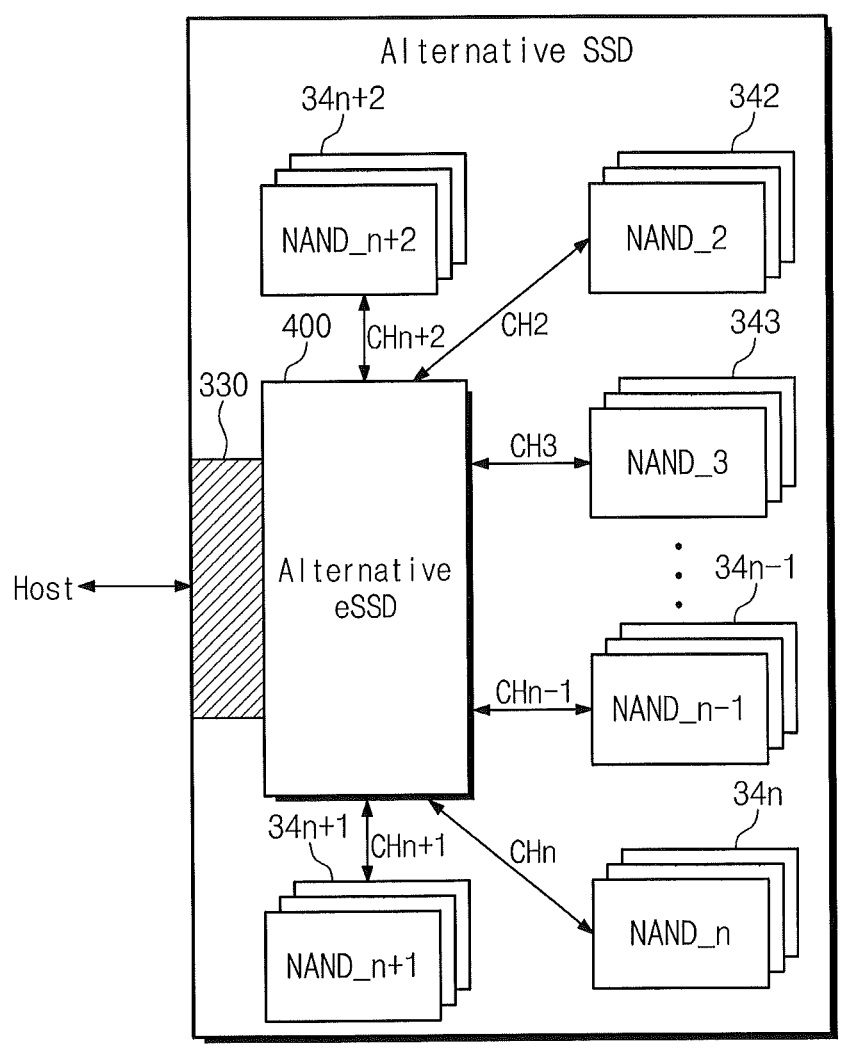
FIGS. 15 through 19 are drawings illustrating various application examples of a region 1 and a region 2 of the alternative SSD of FIG. 7.

Referring to FIG. 15, an alternative SSD 300a adds NAND flash memories 34n+1 and 34n+2 to the region 1 and the region 2, respectively. By adding the NAND flash memories 34n+1 and 34n+2 to the region 1 and the region 2 respectively, the alternative SSD 300a may have a larger storage space as compared with the SSD 100 of FIG. 1.

Figure 16:
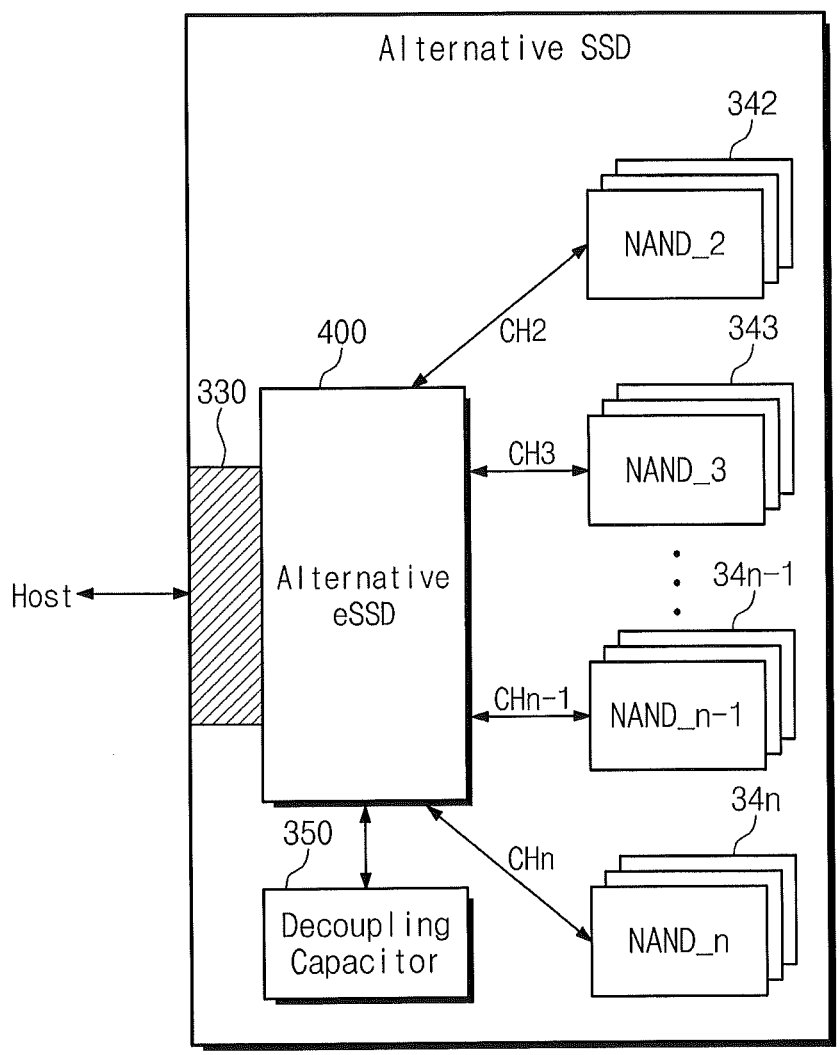

Referring to FIG. 16, an alternative SSD 300b adds a decoupling capacitor 350 to the region 2. By adding the decoupling capacitor 350, the alternative SSD 300b may have a strong resistance against power noise as compared with the SSD 100 of FIG. 1.

Figure 17:
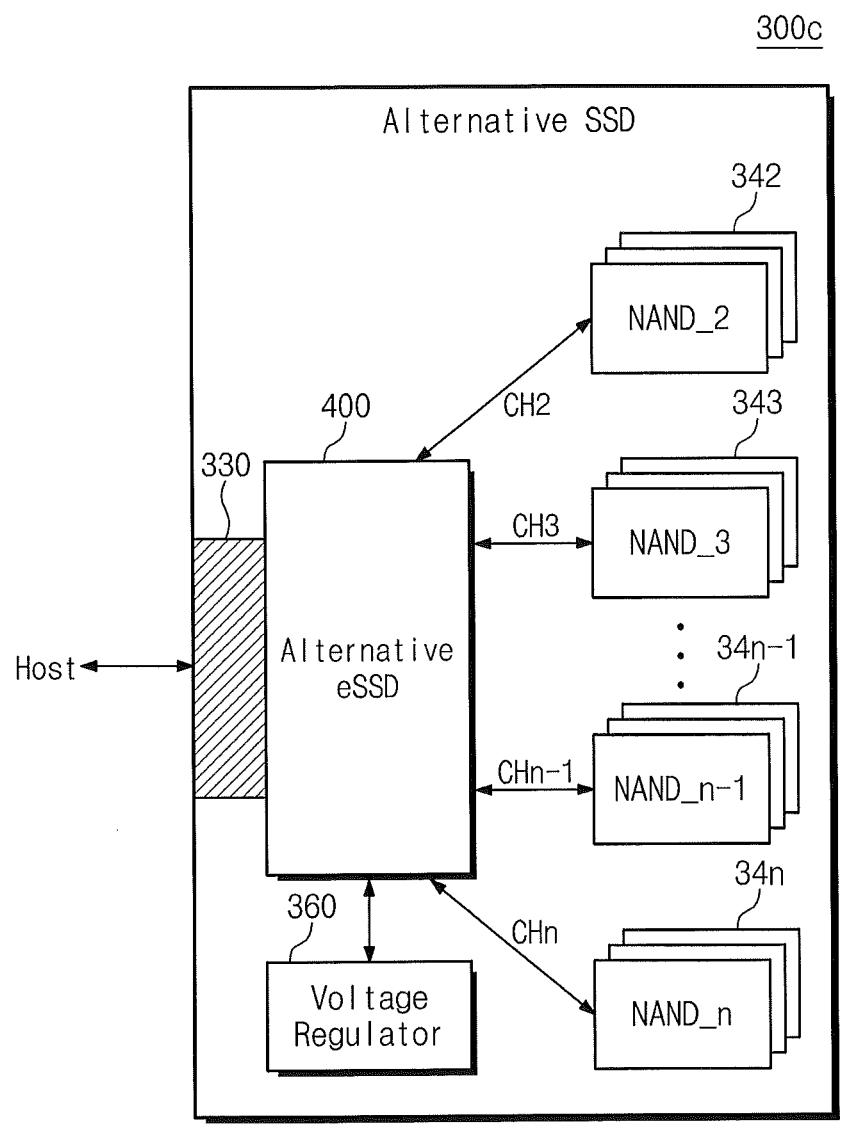

Referring to FIG. 17, an alternative SSD 300c adds a voltage regulator 360 to the region 2. By adding the voltage regulator 360, the alternative SSD 300c can provide a voltage which is accurately clamped at a required voltage as compared with the SSD 100 of FIG. 1.

Figure 18:
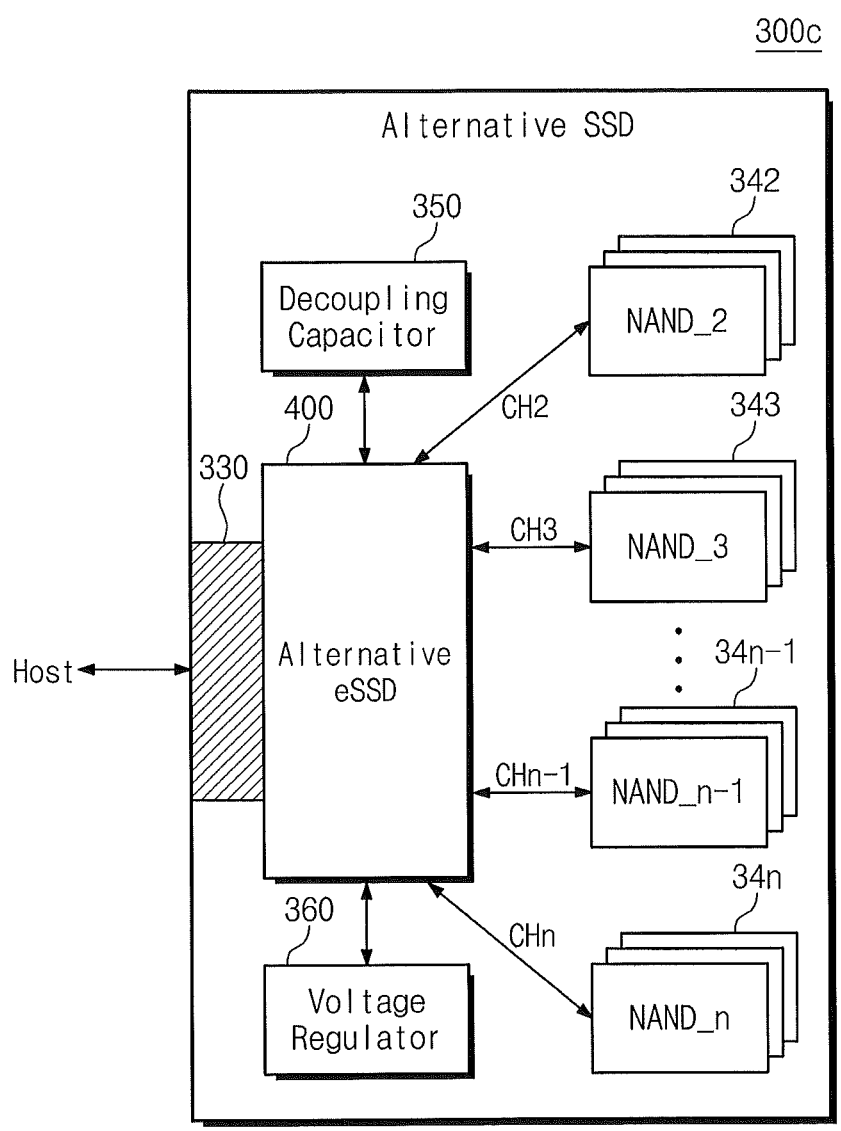

Referring to FIG. 18, an alternative SSD 300d adds the decoupling capacitor 350 and the voltage regulator 360 to the region 1 and the region 2 respectively.

Figure 19:
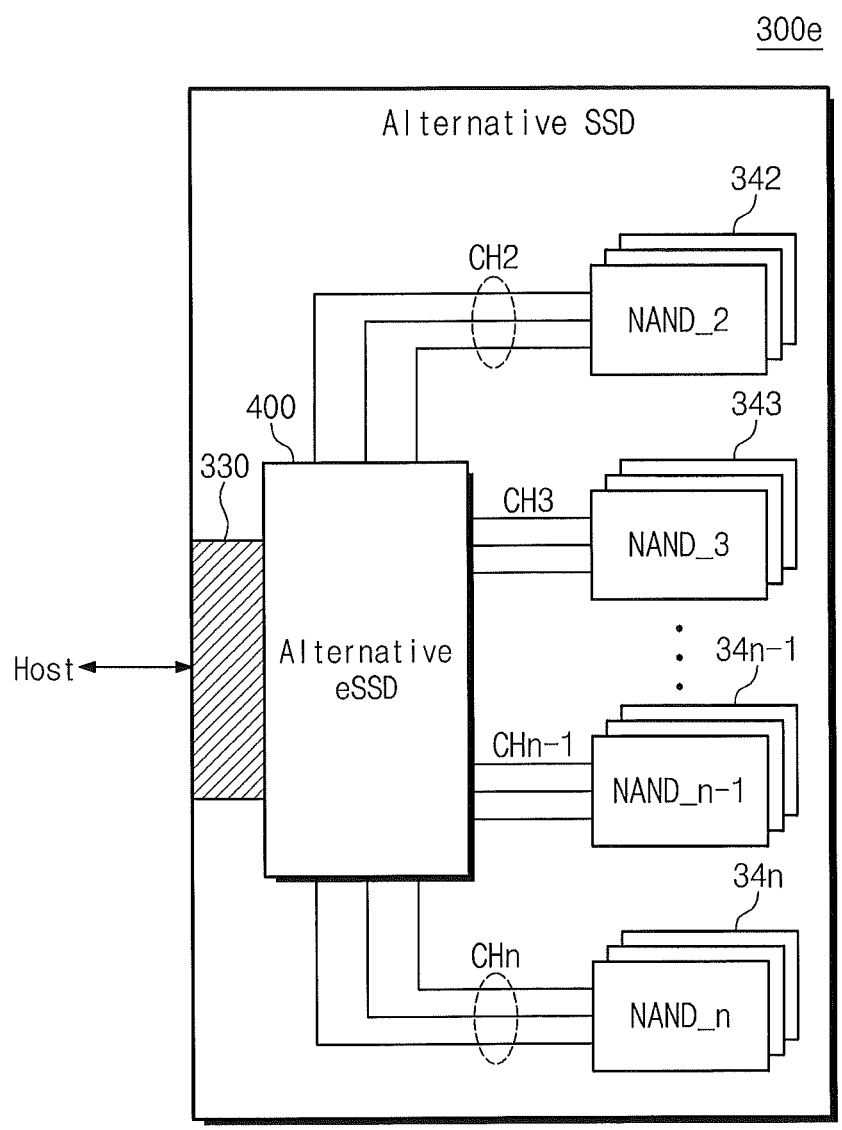

Referring to FIG. 19, an alternative SSD 300e can make use of the region 1 and the region 2 as the use for widening a space between a line and a line. An alternative eSSD 400 performing a function of SSD controller is connected to a plurality of NAND flash memories 342~34n through channels CH2~CHn and each channel includes a plurality of lines. In this case, if a space between a line and a line is narrow, an error due to cross talk may occur.

To reduce or alleviate that problem, as illustrated in FIG. 19, the alternative SSD 300e can be designed so that the channels CH2 and CHn of the NAND flash memories NAND_2 and NAND_n are via the region 1 and the region 2 respectively. As a result, an occurrence of error due to cross talk can be improved.

Figure 20:
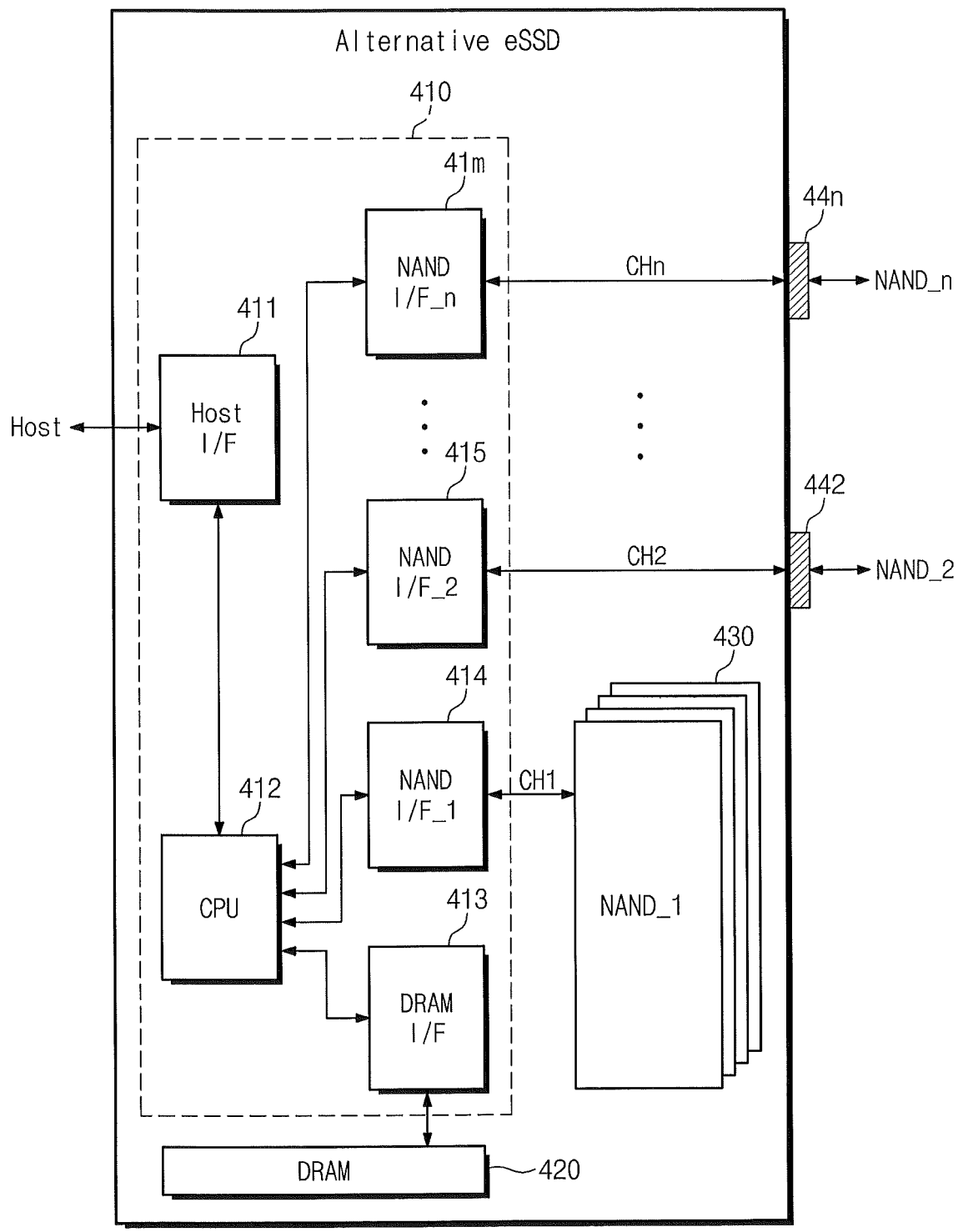
FIGS. 20 and 21 are drawings illustrating some other embodiments of the alternative eSSD.
Figure 21:
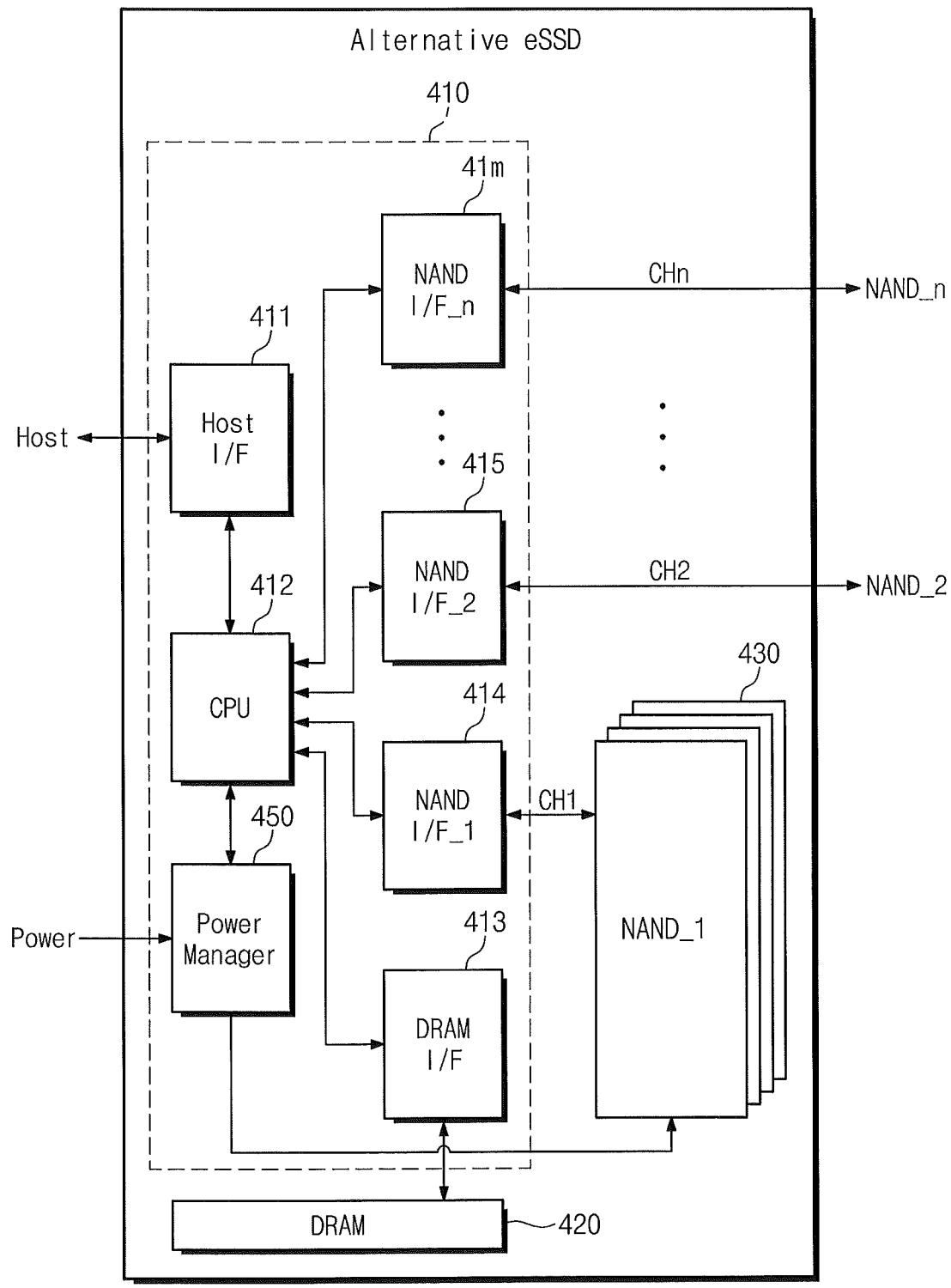

FIGS. 20 and 21 are drawings illustrating some other embodiments of the alternative eSSD.

Improved eSSDs 400a and 400b of FIGS. 20 and 21 are similar to the alternative eSSD of FIG. 9. Thus, hereinafter, a difference between the alternative eSSDs 400a and 400b of FIGS. 20 and 21 and the alternative eSSD of FIG. 9 is mainly described.

Referring to FIG. 20, the alternative eSSD 400a includes an eSSD controller 410, a DRAM 420, a NAND flash memory 430 and a plurality of pads 442~44n.

The plurality of pads 442~44n is provided to connect a plurality of NAND interfaces 415~41m to external NAND flash memories NAND_2~NAND_n. The plurality of pads 442~44n may be embodied in the form of socket type or in the form of connector type.

A user can enlarge a storage space of the alternative eSSD 400a by connecting the NAND flash memories to the alternative eSSD 400a through the plurality of pads 442~44n. Also, the alternative eSSD 400a may be used to replace the SSD controller of SSD.

Referring to FIG. 21, the alternative eSSD 400b includes an eSSD controller 410, a DRAM 420, a NAND flash memory 430 and a plurality of pads 442~44n. The eSSD controller 410 of FIG. 21 may further include a power manager 450. The power manager 450 receives an external power from the outside of the eSSD 400b and adjusts the external power into an internal power. The internal power adjusted by the power manager 450 is provided to the NAND flash memory 430.

In FIGS. 20 and 21, the NAND flash memory 430 of the alternative eSSDs 400a and 400b is connected to the eSSD controller 410 through one channel. However, this is only an illustration. For instance, as described in FIG. 9, NAND flashes of the NAND flash memory 430 may be connected to the eSSD controller 410 through a plurality of channels. The alternative eSSDs 400a and 400b may further include a plurality of NAND flash memories besides the NAND flash memory 430 and the plurality of NAND flash memories may be connected to the eSSD controller 410 through different channels.

Figure 22:
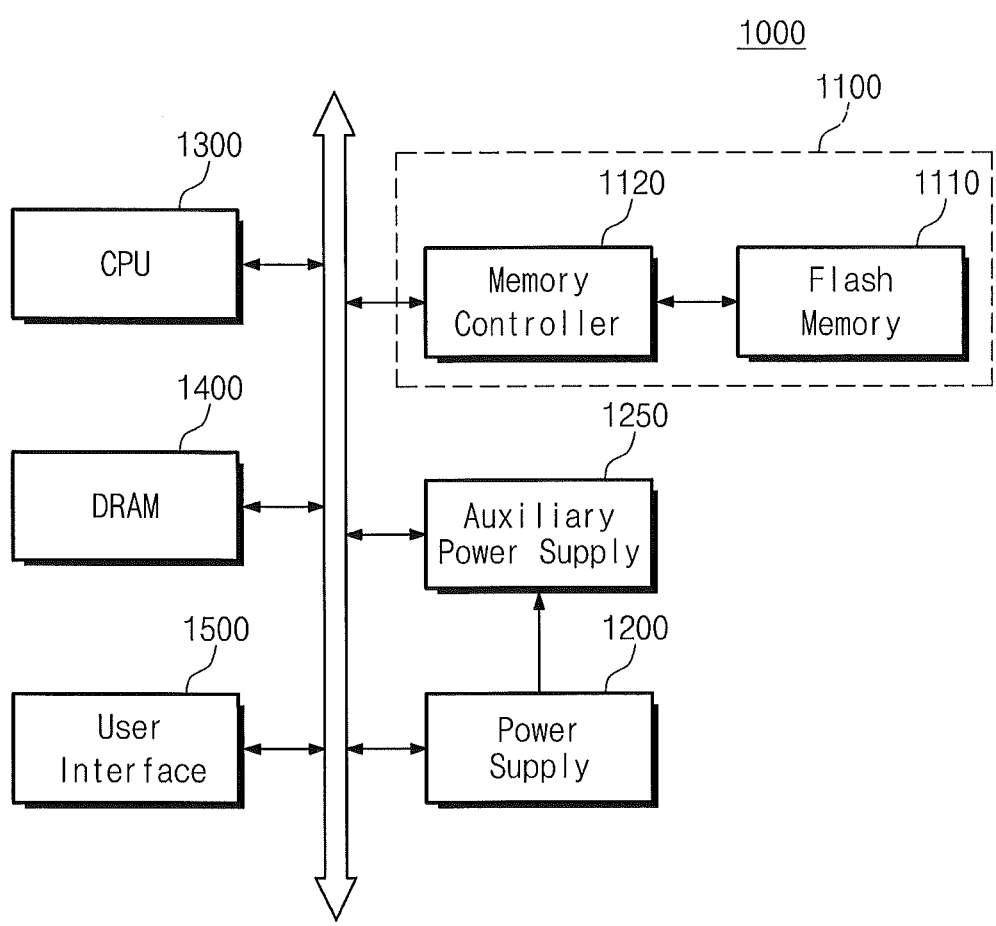
FIG. 22 is a block diagram illustrating an example of an electronic device embodied by a memory system in accordance with some embodiments of the inventive concepts.

FIG. 22 is a block diagram illustrating an example of an electronic device embodied by a memory system in accordance with some embodiments of the inventive concepts. An electronic device 1000 may be embodied by a personal computer PC or a portable electronic device such as a notebook computer, a cell phone, a personal digital assistant (PDA) and a camera.

Referring to FIG. 22, the electronic device 1000 includes a memory system 1100, a power supply 1200, an auxiliary power supply 1250, a central processing unit 1300, a DRAM 1400 and a user interface 1500. The memory system 1100 includes a flash memory 1110 and a memory controller 1120. The memory system 1100 may be built in the electronic device 1000. The memory system 1100 may be embodied in the same manner as the aforementioned alternative SSD.

An SSD in accordance with some embodiments of the inventive concepts uses an eSSD as a controller. In yet other embodiments of the inventive concepts, an SSD comprises a single package eSSD that includes therein an internal solid state disk controller and an internal nonvolatile memory. A plurality of external nonvolatile memory device packages are provided external to the single package eSSD and are connected to the single package eSSD. The internal solid state disk controller is configured to control the plurality of external nonvolatile memory device packages. Thus, the SSD can be embodied in a small area. Since the SSD does not need an additional process for manufacturing a controller, manufacturing cost per unit may be saved.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents. Therefore, the above-disclosed subject matter is to be considered illustrative, and not restrictive.

What is claimed is:

1. A solid state disk comprising:
at least one first nonvolatile memory device configured to store data; and
an embedded solid state disk configured as a single package within the solid state disk and configured to control the at least one first nonvolatile memory device via a plurality of nonvolatile memory channels,
wherein the embedded solid state disk comprises at least one second nonvolatile memory device internal to the single package and at least one volatile memory device internal to the single package,
wherein connectors of the plurality of nonvolatile memory channels for electrically connecting between the at least one first nonvolatile memory device and the embedded solid state disk are disposed at an outer side of the embedded solid state disk,
wherein the at least one first nonvolatile memory device is external to, and separate from, the single package of the embedded solid state disk, and
wherein the at least one volatile memory device internal to the single package is configured to store data temporarily while awaiting storing in the at least one first nonvolatile memory device and the at least one second nonvolatile memory device internal to the single package.

2. The solid state disk of claim 1, wherein the embedded solid state disk comprises:

a first layer including a control logic that is configured to control access to the at least one first nonvolatile memory device; and a second layer that is stacked on the first layer and includes the at least one second nonvolatile memory internal to the single package.

3. The solid state disk of claim 2, further a comprising at least one volatile memory configured to store data temporarily while awaiting storing in the at least one first nonvolatile memory device wherein the at least one volatile memory is stacked on the first layer.

4. The solid state disk of claim 1, wherein the embedded solid state disk further comprises a plurality of nonvolatile memory interfaces, wherein at least one of the plurality of nonvolatile memory interfaces is configured to interface with the at least one first nonvolatile memory device via the plurality of nonvolatile memory channels.

5. The solid state disk of claim 4, wherein the embedded solid state disk further comprises:

a host interface configured to interface with a host; and a host channel configured to connect the host interface and the host, wherein the connectors of the plurality of nonvolatile memory channels are disposed at an outer side of the host channel.

6. The solid state disk of claim 1, further comprising a decoupling capacitor configured to reduce a power noise to the at least one first nonvolatile memory device.

7. The solid state disk of claim 1, further comprising a voltage regulator configured to clamp a voltage that is provided to the at least one first nonvolatile memory device.

8. An embedded solid state disk comprising:

a single package;

an internal central processing unit in the single package;

an internal volatile memory in the single package;

an internal nonvolatile memory in the single package and configured to store data under control of the internal central processing unit; and a plurality of external memory interfaces in the single package, a respective one of which is configured to interface with a respective one of a plurality of external nonvolatile memories located outside the single package, under control of the internal central processing unit, wherein the internal volatile memory in the single package is configured to store data temporarily while awaiting storing in the internal nonvolatile memory in the singe package and the plurality of external nonvolatile memories.

9. The embedded solid state disk of claim 8, further comprising:

a host interface configured to interface with a host; and a plurality of channels, a respective one of which is configured to connect a respective one of the plurality of external memory interfaces and a respective one of the plurality of external nonvolatile memories, wherein input/output connectors corresponding to the plurality of channels are disposed at an outer side of input/output connectors corresponding to the host interface.

10. The embedded solid state disk of claim 8, further comprising:

a first printed circuit board in the single package on which the internal central processing unit is mounted; and a second printed circuit board in the single package on which the internal nonvolatile memory is mounted, wherein the first printed circuit board and the second printed circuit board have a laminated structure.

11. The embedded solid state disk of claim 10, wherein the plurality of external memory interfaces are mounted on the second printed circuit board in the single package.

12. The embedded solid state disk of claim 8, wherein the embedded solid state disk is configured to control a solid state disk.

13. A solid state disk comprising:

a single package embedded solid state disk that includes therein an internal solid state disk controller internal to the single package, an internal nonvolatile memory internal to the single package, and an internal volatile memory internal to the single package; and a plurality of external nonvolatile memory device packages that are external to the single package embedded solid state disk and are connected to the single package embedded solid state disk, the internal solid state disk controller internal to the single package being configured to control the plurality of external nonvolatile memory device packages that are external to the single package, wherein the internal volatile memory internal to the single package is configured to store data temporarily while awaiting storing in the internal nonvolatile memory internal to the single package and the plurality of external nonvolatile memory device packages.

14. The solid state disk of claim 13 wherein the internal solid state disk controller and the internal nonvolatile memory are included in different layers of the single package embedded solid state disk.

15. The solid state disk of claim 13 wherein the single package embedded solid state disk further includes therein a host channel and a plurality of nonvolatile memory channels, a respective one of which is configured to connect to a respective one of the plurality of external nonvolatile memory device packages, the plurality of nonvolatile memory channels being disposed about a periphery of the single package embedded solid state disk.

16. The solid state disk of claim 13 wherein the single package embedded solid state disk further includes therein a decoupling capacitor internal to the single package.

17. The solid state disk of claim 13 wherein the single package embedded solid state disk further includes therein a voltage regulator internal to the single package.

18. The embedded solid state disk of claim 8, wherein the single package comprises a single chip.

19. The solid state disk of claim 13, wherein the single package comprises a single chip.

20. The solid state disk of claim 13 wherein the single package embedded solid state disk is directly mounted on a board, and the plurality of external nonvolatile memory device packages are separately mounted on the board.

* * * * *